United States Patent
Ochiai et al.

(12)

(10) Patent No.: US 6,294,894 B1
(45) Date of Patent: Sep. 25, 2001

(54) RECHARGEABLE BATTERY ARRANGEMENT

(75) Inventors: Makoto Ochiai, Oyama; Masato Suzuki, Toride, both of (JP)

(73) Assignee: Hitachi Maxell, Ltd., Osaka (JP)

(*) Notice: Subject to any disclaimer, the term of this patent is extended or adjusted under 35 U.S.C. 154(b) by 0 days.

(21) Appl. No.: 09/635,128

(22) Filed: Aug. 9, 2000

(30) Foreign Application Priority Data

Aug. 9, 1999 (JP) .................................................. 11-225169
Aug. 9, 1999 (JP) .................................................. 11-225170

(51) Int. Cl.⁷ .................................................. H01M 10/46
(52) U.S. Cl. ........................................... 320/132; 320/149
(58) Field of Search ..................................... 320/116, 127, 320/128, 132, 137, 149, DIG. 21; 324/426, 427, 433

(56) References Cited

U.S. PATENT DOCUMENTS

| 4,876,513 | * | 10/1989 | Brilmyer et al. . |
| 5,432,429 | * | 7/1995 | Armstrong, II et al. . |
| 5,440,221 | * | 8/1995 | Landau et al. . |
| 5,596,260 | * | 1/1997 | Moravec et al. . |
| 5,955,869 | * | 9/1999 | Rathmann . |
| 6,160,382 | * | 12/2000 | Yoon et al. . |

* cited by examiner

*Primary Examiner*—Edward H. Tso
(74) *Attorney, Agent, or Firm*—Birch, Stewart, Kolasch & Birch, LLP (57) ABSTRACT

A rechargeable battery arrangement in which total service capacity for discharge from full charging to a final discharge voltage varies according to discharge conditions for discharging charged electric charge, comprising: an integration member which integrates quantity of electric charge discharged between a point of start of discharge after charging and the present; a data storage member for storing a plurality of total service capacities for discharge at a plurality of values of discharge current, respectively in unique association with a specific one of the total service capacities for discharge at a specific one of the values of discharge current; a current detection member for detecting a present value of discharge current; and a calculation member which obtains, from data obtained by the data storage member on the basis of the present value of discharge current detected by the current detection member, a total service capacity corresponding to or closest to the present value of discharge current and calculates, from the total service capacity and an integrated value obtained by the integration member, a residual capacity of electric charge for discharge.

7 Claims, 9 Drawing Sheets

RECHARGEABLE BATTERY ARRANGEMENT

BACKGROUND OF THE INVENTION

1. Field of the Invention

The present invention generally relates to a rechargeable battery arrangement including a rechargeable battery, a rechargeable battery pack, etc. and more particularly, to a lithium ion secondary battery (lithium battery) and its rechargeable battery pack, which each include an internal circuit capable of externally outputting a residual capacity of the battery corresponding to a state of use of the battery.

2. Description of the Prior Art

Conventionally, when a lithium battery or the like has been discharged, the storage battery is initially charged at constant current. Then, when the storage battery has been considerably charged to a substantially full charging state, its charging is changed over to that at constant voltage. During charging of the storage battery at constant voltage, when charging current has reached not more than a predetermined value or charging voltage has reached not less than a predetermined value, a charging switch is turned off by judging that the storage battery has been charged fully, thereby resulting in termination of the charging. In order to prevent overcharge, a controller for controlling charging or a portion of its circuit is incorporated into or provided integrally with a lithium ion battery or its rechargeable battery pack.

The rechargeable battery or the rechargeable battery pack of this kind is incorporated into an electronic device such as a portable computer, a handheld electronic device or the like. When voltage of the rechargeable battery has dropped to not more than a predetermined value, the rechargeable battery is charged by a charging circuit in the electronic device. When charging of the rechargeable battery by charging current has been completed, the charging is terminated. Then, when the electronic device is driven by the battery, the battery performs discharge so as to supply electric power to the electronic device. To this end, a controller for controlling charging is provided with a relay or a relay device for effecting bidirectional flow of electric current between a positive electrode of the rechargeable battery and a charging terminal so as to switch direction of electric current. Meanwhile, a diode is inserted in series in a direction of each of charging and discharge so as to have a diode changeover circuit which selects electric current in one direction and blocks electric current in the opposite direction.

When the electronic device having the rechargeable battery of this kind is connected to an AC power source and is not being operated or is being operated, the rechargeable battery is charged. When the electronic device is operated by disconnecting the electronic device from the AC power source, the electronic device is operated by electric power from the rechargeable battery.

Recently, batteries conforming to smart battery standards have been developed and used as batteries to be incorporated into electronic devices of this kind. In the smart battery standards, a processor (MPU) in the electronic device and a control circuit which is provided as an internal circuit of the rechargeable battery and includes a further processor (MPU) are connected to each other by an SM (system management) bus such that the further processor of the rechargeable battery can transmit data on states of the rechargeable battery to the processor of the electronic device. One of such data on states of the rechargeable battery includes data on a residual capacity of the rechargeable battery. The data on the residual capacity of the rechargeable battery is usually used for judging whether or not data processing scheduled in the electronic device can be performed without malfunction by the present residual capacity of the rechargeable battery.

In the conventional battery conforming to the smart battery standards, in case the data on a residual capacity of the rechargeable battery is transmitted to the electronic device, discharge current is detected each time the electronic device has been used so as to obtain a quantity of consumed electricity, i.e., a quantity of discharged electricity from current consumed between a point of full charging and the present such that the residual capacity of the rechargeable battery is obtained by subtracting the obtained quantity of consumed electricity from a total service capacity up to a preset final discharge voltage, for example, a fixed total service capacity $Q_0$ having 3.0 V as the final discharge voltage.

However, if discharge conditions such as discharge current, temperature, etc. vary, the total service capacity up to termination of discharge also varies, thereby resulting in variations of residual capacity of the discharge battery. In case such a phenomenon is not taken into consideration, the residual capacity of the rechargeable battery should be calculated so as to include allowance for variations of the discharge conditions. Therefore, such a problem arises that since the calculated residual capacity of the rechargeable battery becomes inaccurate and the residual capacity of the rechargeable battery is outputted in a state where the rechargeable battery has not been used sufficiently, charging of the rechargeable battery is repeated many times and thus, operating efficiency of the rechargeable battery deteriorates on the contrary.

SUMMARY OF THE INVENTION

Accordingly, an essential object of the present invention is to provide, with a view to eliminating the above mentioned drawbacks of prior art, a rechargeable battery arrangement which includes an internal circuit capable of not only externally outputting a residual capacity of a rechargeable battery corresponding to a state of use of the rechargeable battery but improving operating efficiency of the rechargeable battery.

In order to accomplish this object of the present invention, a rechargeable battery arrangement in which total service capacity for discharge from full charging to a final discharge voltage varies according to discharge conditions for discharging charged electric charge, according to the present invention comprises: an integration means which integrates quantity of electric charge discharged between a point of start of discharge after charging and the present; a data storage means for storing a plurality of total service capacities for discharge at a plurality of values of discharge current, respectively in unique association with a specific one of the total service capacities for discharge at a specific one of the values of discharge current; a current detection means for detecting a present value of discharge current; and a calculation means which obtains, from data obtained by the data storage means on the basis of the present value of discharge current detected by the current detection means, a total service capacity corresponding to or closest to the present value of discharge current and calculates, from the total service capacity and an integrated value obtained by the integration means, a residual capacity of electric charge for discharge.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Figure 1:
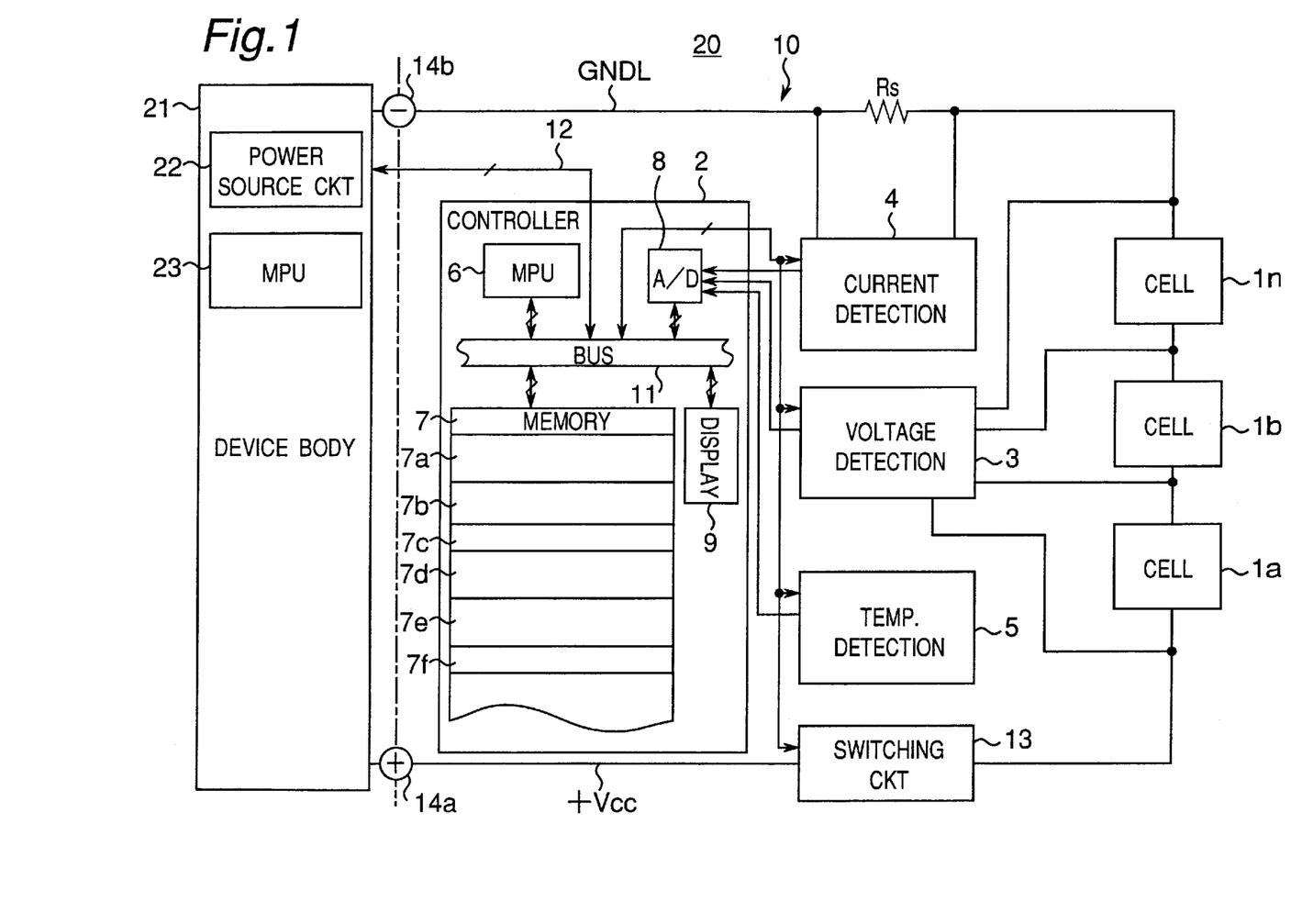
FIG. 1 is a circuit diagram showing a lithium rechargeable battery according to a first embodiment of the present invention incorporated into an electronic device.

Referring now to FIG. 1, a lithium rechargeable battery 10 according to a first embodiment of the present invention, which acts as a rechargeable battery arrangement, is detachably mounted in an electronic device 20. The rechargeable battery 10 has a built-in charging control circuit and includes a plurality of lithium battery cells (battery units) 1a, 1b, - - -, 1n which are connected to each other in series. In FIG. 1, the three battery cells 1a, 1b and 1n only are illustrated for the sake of clarity. Meanwhile, the electronic device 20 includes a device body 21 in which a power source circuit 22 and a microprocessing unit (MPU) 23 are provided. The battery cells 1a, 1b and 1n receive charging current from the power source circuit 22 of the device body 21 through a charge and discharge terminal 14a, a power source line +Vcc, a charge and discharge switching circuit 13, while electric power is supplied to the device body 21 via the charge and discharge terminal 14a by discharge current from the battery cells 1a, 1b and 1n. Meanwhile, a present residual capacity is read from the rechargeable battery 10 by the MPU 23 of the device body 21 via an SM (system management) bus 12.

Meanwhile, the power source line +Vcc is connected to the charge and discharge terminal 14a and is connected to the device body 21 through the charge and discharge terminal 14a. A ground line GNDL is connected to a grounding terminal 14b and is connected to ground of the device body 21 via the grounding terminal 14b.

The built-in circuit of the rechargeable battery 10 is usually formed by a CMOS (complementary metal oxide semiconductor) or the like and is of a low power consumption type having low clock frequency. Since operating power of this built-in circuit is quite small, this built-in circuit is operated by electric power from the rechargeable battery 10 except for a case in which the rechargeable battery 10 is being charged. Full charging of the rechargeable battery is detected when a terminal voltage of the battery cell has assumed not less than a predetermined value, for example, 4.3 V.

The power source circuit 22 of the device body 21 includes a circuit for switching power source of the device body 21 to the rechargeable battery 10 and a commercial AC power source. The device body 21 is usually operated by electric power from the commercial AC power source. The charge and discharge switching circuit 13 is provided between a positive electrode of the battery cell 1a and the power source line +Vcc and has a charge switch and a discharge switch such that the charge switch and the recharge switch are subjected to on-off control by a controller 2 of the rechargeable battery 10 in response to charging and discharge. Meanwhile, the power source line +Vcc may be directly connected to the positive electrode of the battery cell 1a by eliminating the charge and discharge switching circuit 13. In addition to the controller 2, a voltage detection circuit 3, a current detection circuit 4 and a temperature detection circuit 5 are provided in the rechargeable battery 10.

The voltage detection circuit 3 is connected to a positive electrode and a negative electrode of each of the battery cells 1a, 1b and 1n so as to detect terminal voltages of the respective battery cells 1a, 1b and 1n and outputs the present voltages of the respective battery cells 1a, 1b and 1n to the controller 2 in accordance with a control signal from the controller 2. When it is found from the voltages of the battery cells 1a, 1b and 1n that one of the battery cells 1a, 1b and 1n is under overcharge, the controller 2 controls the charge and discharge switching circuit 13 so as to turn off the charge switch of the charge and discharge switching circuit 13 such that charging of the one of the battery cells 1a, 1b and 1n is terminated. On the contrary, when it is found from the voltages of the battery cells 1a, 1b and 1n that one of the voltages of the battery cells 1a, 1b and 1b is under overdischarge, the controller 2 controls the charge and discharge switching circuit 13 so as to turn off the discharge switch of the charge and discharge switching circuit 13 such that discharge of the one of the battery cells 1a, 1b and 1n is terminated.

The current detection circuit 4 has a detection resistor Rs inserted in series between the negative electrode of the battery cell 1n and the ground line GNDL. The current detection circuit 4 outputs a present value of charging current or discharge current to the controller 2 in accordance with a control signal from the controller 2. Meanwhile, whether electric charge is charging current or discharge current depends on polarity of a terminal voltage of the detection resistor Rs. The temperature detection circuit 5 has a temperature sensor (not shown) and receives a signal on a present temperature from the temperature sensor so as to output the present temperature to the controller 2 in accordance with a control signal from the controller 2.

The controller 2 includes a microprocessing unit (MPU) 6, a memory 7, an A/D converter 8 and a display unit 9 which are connected to one another by a bus 11 and receive the above mentioned control signals through the bus 11. The detection signals from the voltage detection circuit 3, the current detection circuit 4 and the temperature detection circuit 5 are delivered to MPU 6 via the A/D converter 8. The memory 7 includes a program 7a for calculating an integrated quantity of discharged electricity, a program 7b for detecting a battery deterioration degree, a program 7c for calculating a residual capacity of the battery, a program 7d for calculating a residual service life of the battery, a table 7e having a plurality of tables showing total service capacities corresponding to the battery deterioration degrees, respectively and a parameter storage area 7f. The number N of charging operations and a reference total service capacity $Q_0$ to be described later are stored in the parameter storage area 7f.

The MPU 6 fetches the program 7a from the memory 7 periodically at a predetermined period Δt by the MPU 6 so as to execute the program 7a. When the MPU 6 has executed the program 7a, the MPU 6 obtains a present value i of discharge current of the rechargeable battery 10 from the current detection circuit 4 in accordance with the control signal and stores the present value i of discharge current in the memory 7. Furthermore, the MPU 6 calculates an integrated quantity of electricity discharged from a point of full charging to the present, i.e., an integrated quantity $Q_n$ of discharged electricity by adding to a previous integrated quantity $Q_{n-1}$ of discharged electricity a consumed service capacity of (ixΔt) obtained from the present value i of discharge current and the period Δt so as to store the integrated quantity $Q_n$ of discharged electricity and fetches the program 7b from the memory 7.

The program 7b is provided for judging a battery deterioration degree corresponding to the number of charging and discharge cycles. When the MPU 6 has executed the program 7b by fetching the program 7b from the memory 7, the MPU 6 obtains a present temperature T of the rechargeable battery 10 from the temperature detection circuit 5 and stores the present temperature T of the rechargeable battery 10 in a predetermined area of the memory 7. When the number N of charging operations ranges from 1 to 100, from 101 to 200 and from 201 to 300 and is not less than 301, the MPU 6 judges that deterioration degrees L of the rechargeable battery 10 are 1, 2, 3 and 4, respectively by referring to the number N of charging operations stored in the parameter storage area 7f and stores in the memory 7 the deterioration degree N obtained at this time. Subsequently, the MPU 6 fetches the program C from the memory 7. The number N of charging operations stored in the parameter storage area 7f is incremented by the controller 2 each time charging is performed. Thus, the number N of charging operations has an initial value of "0".

Generally, since a rechargeable battery deteriorates upon repetition of charging and discharge cycles, total service capacity of the rechargeable battery gradually decreases due to this deterioration of the rechargeable battery. Therefore, in this embodiment, the number N of charging operations is used as a factor for judging deterioration of the rechargeable battery. However, the deterioration degree L can also be judged based on actual reduction of total service capacity as follows. A total service capacity from the previous full charging to a final discharge voltage is integrated by the program 7a and a total service capacity at the time of the present full charging is stored in the memory 7. The total service capacity is classified into four ranges corresponding to the deterioration degrees, respectively in the same manner as described above. By judging in which one of the ranges the total service capacity of the present full charging falls, the deterioration degree of the rechargeable battery 10 is determined. Alternatively, the total service capacity of the present full charging may be stored in the parameter storage area 7f in place of the number N of charging operations and read out of the parameter storage area 7f at the time of discharge after the next full charging so as to determine the deterioration degree of the rechargeable battery 10 at the time of discharge after the next full charging. By utilizing the thus determined deterioration degree L of the rechargeable battery 10, the following processing is performed.

When the MPU 6 has executed the program 7c by fetching the program 7c from the memory 7, the MPU 6 selects the table corresponding to the determined deterioration degree L of the rechargeable battery 10 by referring to the table 7e and obtains from the table a correction factor Ki corresponding to a value of discharge current closest to the present value i of discharge current and a temperature closest to the present temperature T of the rechargeable battery 10 so as to calculate a total service capacity $Q_a$ corresponding to the deterioration degree L of the rechargeable battery 10 by multiplying the reference total service capacity $Q_0$ by the correction factor Ki, i.e., $Q_a=Q_0 \times Ki$. Then, by using the integrated quantity $Q_n$ of electricity discharged up to the present and the total service capacity $Q_a$, the MPU 6 calculates a residual capacity $Q_r$ of the rechargeable battery 10 by subtracting the integrated quantity $Q_n$ of discharged electricity from the total service capacity $Q_a$, i.e., $Q_r=Q_a-Q_n$. Thereafter, the MPU 6 fetches the program 7d from the memory 7.

Figure 3:
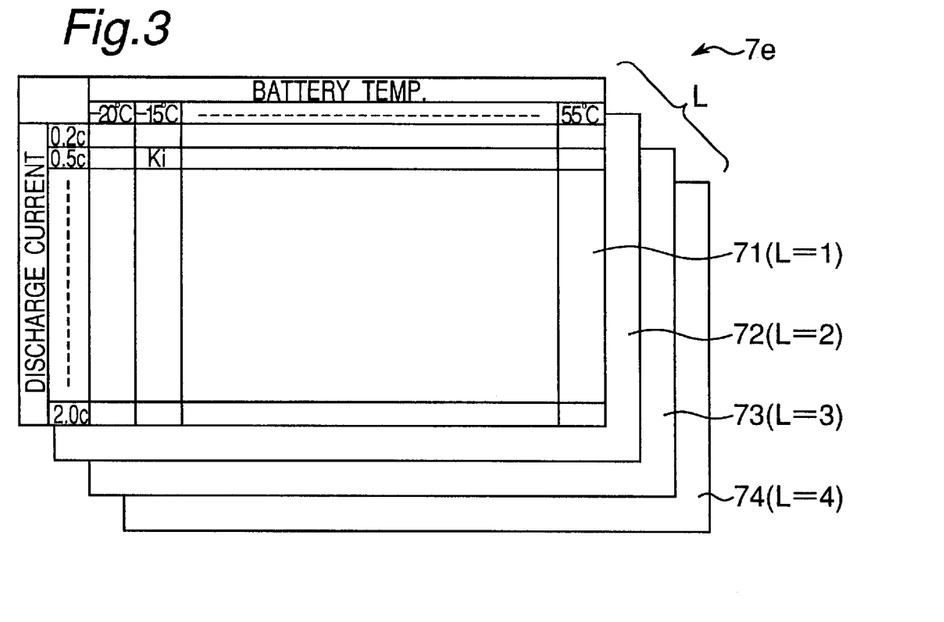
FIG. 3 is a view explanatory of a table on total service capacities of the battery of FIG. 1 corresponding to its deterioration degrees, respectively.

When the MPU 6 has executed the program 7d by fetching the program 7d from the memory 7, the MPU 6 calculates a residual service life TL of the rechargeable battery 10 by dividing the residual capacity $Q_r$ of the rechargeable battery 10 by the present value i of discharge current, i.e., $TL=Q_r/i$. Then, the MPU 6 outputs this residual service life TL of the rechargeable battery 10 to the display unit 9 and further outputs the residual service life TL of the rechargeable battery 10 to the MPU 23 of the device body 21 via the SM bus 12 through interruption. Meanwhile, in this case, the residual service life TL of the rechargeable battery 10 may also be stored in the memory 7 so as to be outputted by the MPU 6 in response to a request from the MPU 23 of the device body 21. Furthermore, in place of the residual service life TL of the rechargeable battery 10, the MPU 6 may output either the residual capacity $Q_r$ of the rechargeable battery 10 or both the residual service life TL and the residual capacity $Q_r$ of the rechargeable battery 10 to the MPU 23 of the device body 21 . PR As shown in FIG. 3, the table 7e is constituted by four tables 71, 72, 73 and 74 corresponding to the battery deterioration degrees L of 1, 2, 3 and 4, respectively. For specific values of discharge current ranging from 0.2 c to 2.0 c and specific temperatures of the rechargeable battery 10 ranging from −20° C. to 55° C. at an interval of 5° C., total service capacities for discharge from full charging to the final discharge voltage are stored as the correction factors Ki in each of the tables 71 to 74. In the tables 71 to 74, the left-end column represents the specific values of discharge current, while the uppermost row represents the specific temperatures of the rechargeable battery 10.

Figure 4:
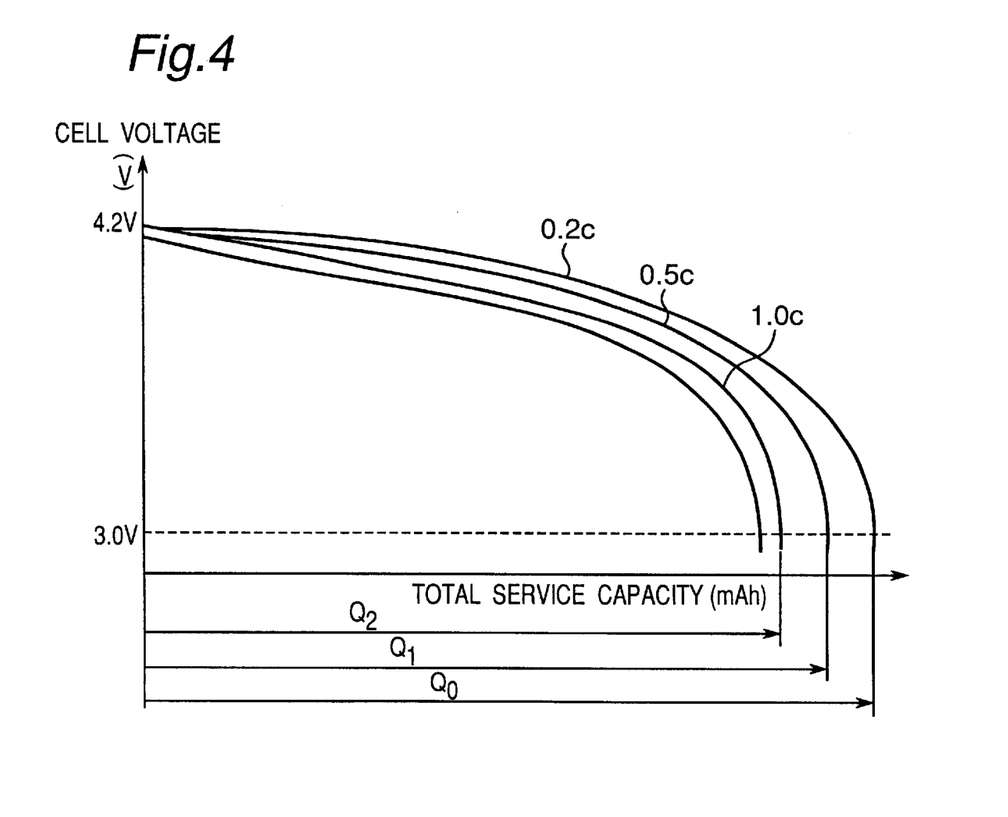
FIG. 4 is a graph showing characteristics of total service capacities of the battery of FIG. 1 at specific values of electric current, respectively.

In data shown in the tables 71 to 74, FIG. 4 shows relation among the total service capacities for discharge from full charging to the final discharge voltage at the specific values of discharge current at a temperature of 25° C. In FIG. 4, the ordinate axis represents voltage of the single battery cell in volts, while the abscissa axis represents the total service capacity in mAh. In FIG. 4, "$Q_0$", "$Q_1$" and "$Q_2$" denote total service capacities for discharge up to a final discharge voltage of 3.0 V when the specific values of discharge current are 0.2 c, 0.5 c and 1.0 c, respectively. Meanwhile, "1.0 c" denotes a value of electric current at which a design capacity can be wholly discharged in one hour. For example, in a battery having a capacity of 1200 mAh, "1.0 c" denotes 1200 mA, "0.5 c" denotes 600 mA and "0.2 c" denotes 240 mA.

In the table 7e of FIG. 3, the four tables corresponding to the deterioration degrees L of 1, 2, 3 and 4 are provided. In each of the tables, a total service capacity of the single battery cell 1 for discharge up to the final discharge voltage of 3.0 V at the value of 0.2 c of discharge current and at the temperature of 25° C. as shown in FIG. 4 is employed as the reference total service capacity $Q_0$. For the temperature of 25° C., the correction factors Ki are obtained by dividing $Q_1$ and $Q_2$ in FIG. 4, etc. at the temperature of 25° C. by the reference total service capacity $Q_0$. For other temperatures than 25° C., the correction factors Ki are obtained by using also the reference total service capacity $Q_0$ at the temperature of 25° C. and are stored. By storing the correction factors Ki without storing the total service capacities directly, data storage capacity can be lessened.

In the table 7e of FIG. 3, by employing the reference total service capacity $Q_0$ at the value of 0.2 c of discharge current and at the temperature of 25° C., ratios of total service capacities at the specific values of discharge current and at the specific temperatures from −20° C. to 55° C. at an interval of 5° C. to the reference total service capacity $Q_0$ are taken. When the table 7e is referred to, the correction factor Ki corresponding to the present temperature T of the rechargeable battery 10 and the present value i of discharge current is adopted. However, in case the present temperature T of the rechargeable battery 10 and the present value i of discharge current are not contained in the table 7e, a ratio for values closest to the present temperature T of the rechargeable battery 10 and the present value i of discharge current in the table 7e is adopted as the correction factor K.

Figure 2A:
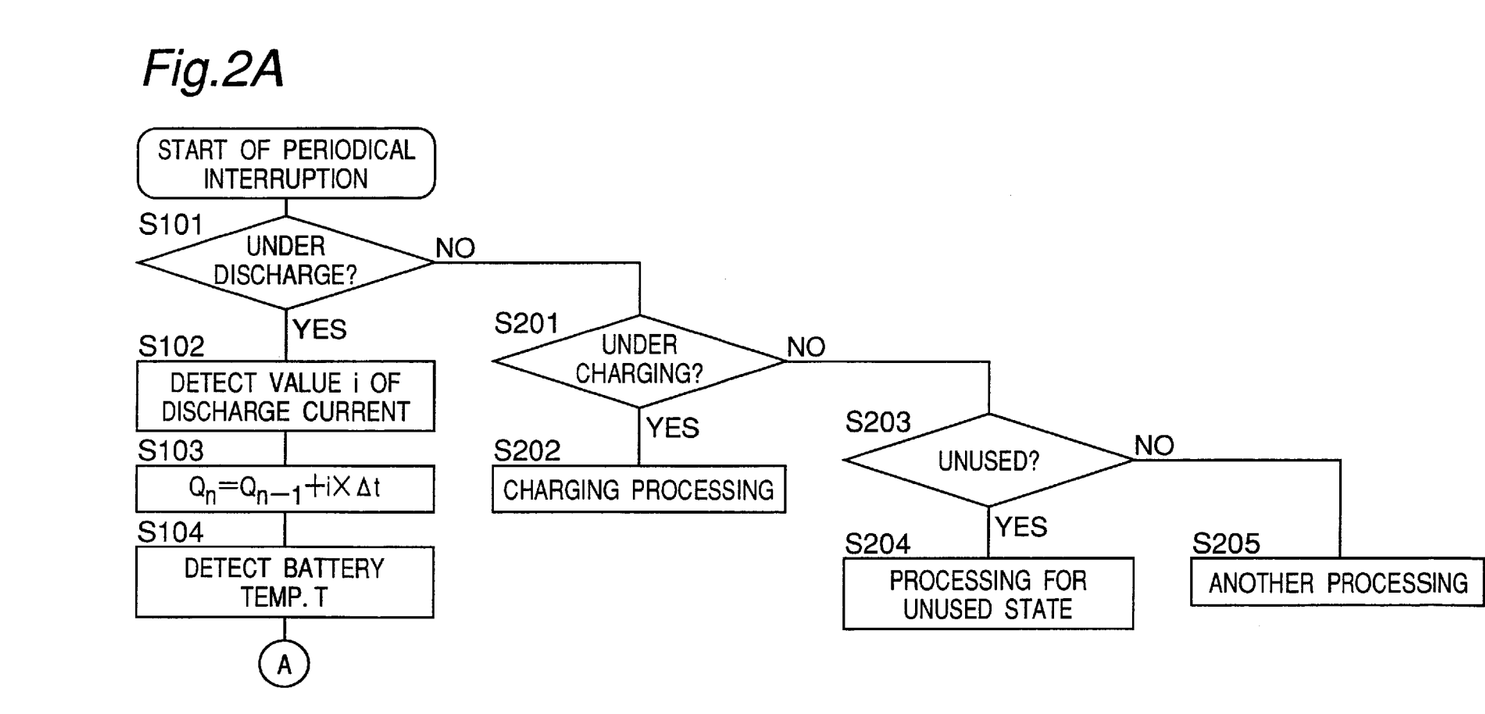
FIGS. 2A and 2B are flowcharts showing processings for calculating a residual capacity of the battery of FIG. 1.
Figure 2B:
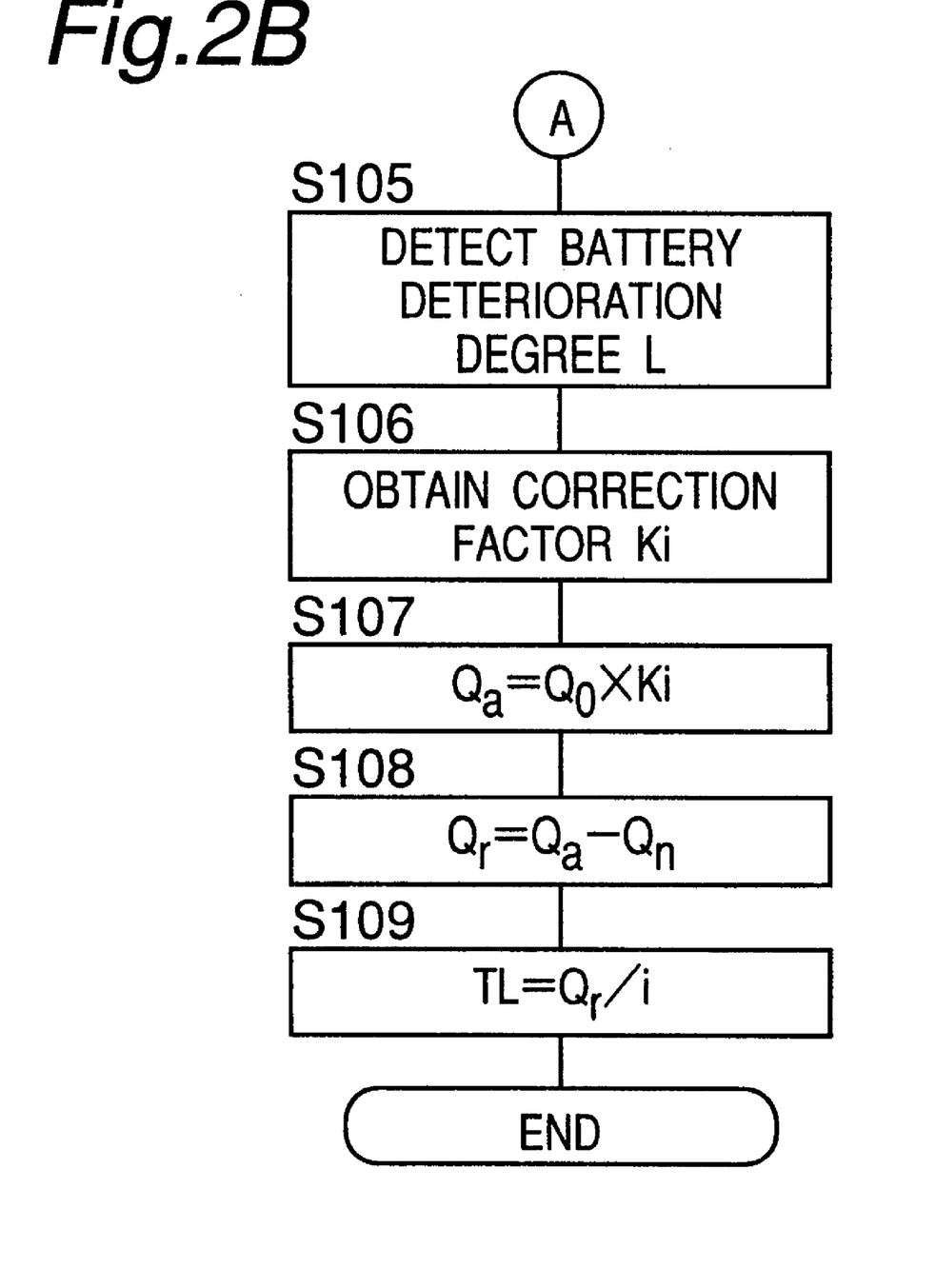

Hereinafter, processings for calculating a residual capacity of the rechargeable battery 10 are described with reference to flowcharts of FIGS. 2A and 2B. Upon start of periodical interruption, it is judged at step S101 whether or not the rechargeable battery 10 is under discharge. In the case of "NO" at step S101, the program flow proceeds to step S201 at which it is judged whether or not the rechargeable battery 10 is under charging. In the case of "YES" at step S201, charging processings such as a processing for monitoring a terminal voltage of each of the battery cells 1a, 1b and 1n under charging are performed at step S202 so as to prevent overcharge of the rechargeable battery 10. On the other hand, in the case of "NO" at step S201, it is judged at step S203 whether or not the rechargeable battery 10 is unused by disconnecting the rechargeable battery 10 from the device body 21. In the case of "YES" at step S203, a processing corresponding to a state in which the rechargeable battery 10 is unused is performed at step S204. Meanwhile, in the case of "NO" at step S203, another processing is performed at step S205.

Meanwhile, in the case of "YES" at step S101, the program 7a is executed by the MPU 6 and thus, the present value i of discharge current is detected at step S102. Then, the integrated quantity $Q_n$ of electricity discharged up to the present is calculated at step S103 by using the equation of $(Q_n=Q_{n-1}+i \times \Delta t)$. It is to be noted that the integrated quantity $Q_n$ of electricity discharged from a point of full charging to a point of start of discharge is zero and the period "$\Delta t$" denotes a duration from the previous calculation to the present calculation. When the rechargeable battery 10 is not under discharge or other processings are performed, periodical interruption at this time may not be performed. In this case, the period $\Delta t$ is set at the specific initial value or becomes larger accordingly.

Subsequently, the MPU 6 executes the program 7b so as to detect the present temperature T of the rechargeable battery 10 at step S104 and detect the present deterioration degree L of the rechargeable battery 10 at step S105 by referring to the number N of charging operations. Then, at step S106, by referring to the table 7e from such parameters as the deterioration degree L of the rechargeable battery 10, the present temperature T of the rechargeable battery 10 and the present value i of discharge current, the correction factor Ki corresponding to or closest to these parameters is obtained.

Thereafter, at step S107, the MPU 6 executes the program 7c and reads out of the memory 7 the reference total service capacity $Q_0$ stored in the program 7c so as to obtain the total service capacity $Q_a$ up to the final discharge voltage of 3.0 V by using the equation of $(Q_a=Q_0 \times Ki)$. Then, at step S108, the residual capacity $Q_r$ of the rechargeable battery 10 is obtained from the integrated quantity $Q_n$ of discharged electricity and the total service capacity $Q_a$ by using the equation of $(Q_r=Q_a-Q_n)$ Furthermore, at step S109, the MPU 6 executes the program 7d so as to obtain the residual service life TL of the rechargeable battery 10 from the present value i of discharge current by using the equation of $(TL=Q_r/i)$ and transfers the residual service life TL of the rechargeable battery 10 to the MPU 23 of the device body 21. Thus, the processings of FIGS. 2A and 2B have been completed.

In the above mentioned first embodiment, a plurality of the tables corresponding to the deterioration degrees L of the rechargeable battery 10, respectively are provided in the table 7e but may be replaced by a single table which does not correspond to the deterioration degrees L of the rechargeable battery 10. Meanwhile, the correction factors Ki are stored in the table 7e by using the present temperature T of the rechargeable battery 10 and the present value i of discharge current as parameters but the total service capacities $Q_a$ may be directly stored in the table 7e instead of the correction factors Ki. Moreover, alternatively, it may also be possible to provide in the table 7e a single table for storing the total service capacities $Q_a$ which do not correspond to the present temperature T of the rechargeable battery 10 but are obtained from characteristics corresponding to specific values of discharge current at ordinary temperature of about 20 to 25° C.

In addition, in the first embodiment, the rechargeable battery in which the battery cells and the circuit including the controller are formed integrally with each other is described as one example of the rechargeable battery arrangement. However, it is needless to say that the present invention can be applied also to a so-called rechargeable battery pack in which a charging circuit and batteries are separately provided initially but are formed integrally with each other subsequently.

As is clear from the foregoing description of the first embodiment of the present invention, since total service capacity up to the final discharge voltage, which varies according to value of discharge current, can be referred to by the value of discharge current at that time, the present total service capacity is estimated from the present value of discharge current such that the residual capacity of the rechargeable battery is calculated, so that the residual capacity of the rechargeable battery can be calculated dynamically with higher precision so as to correspond to the value of discharge current at the time. As a result, since the residual capacity and the residual service life of the rechargeable battery can be detected more accurately, operating efficiency of the rechargeable battery can be improved.

Figure 5:
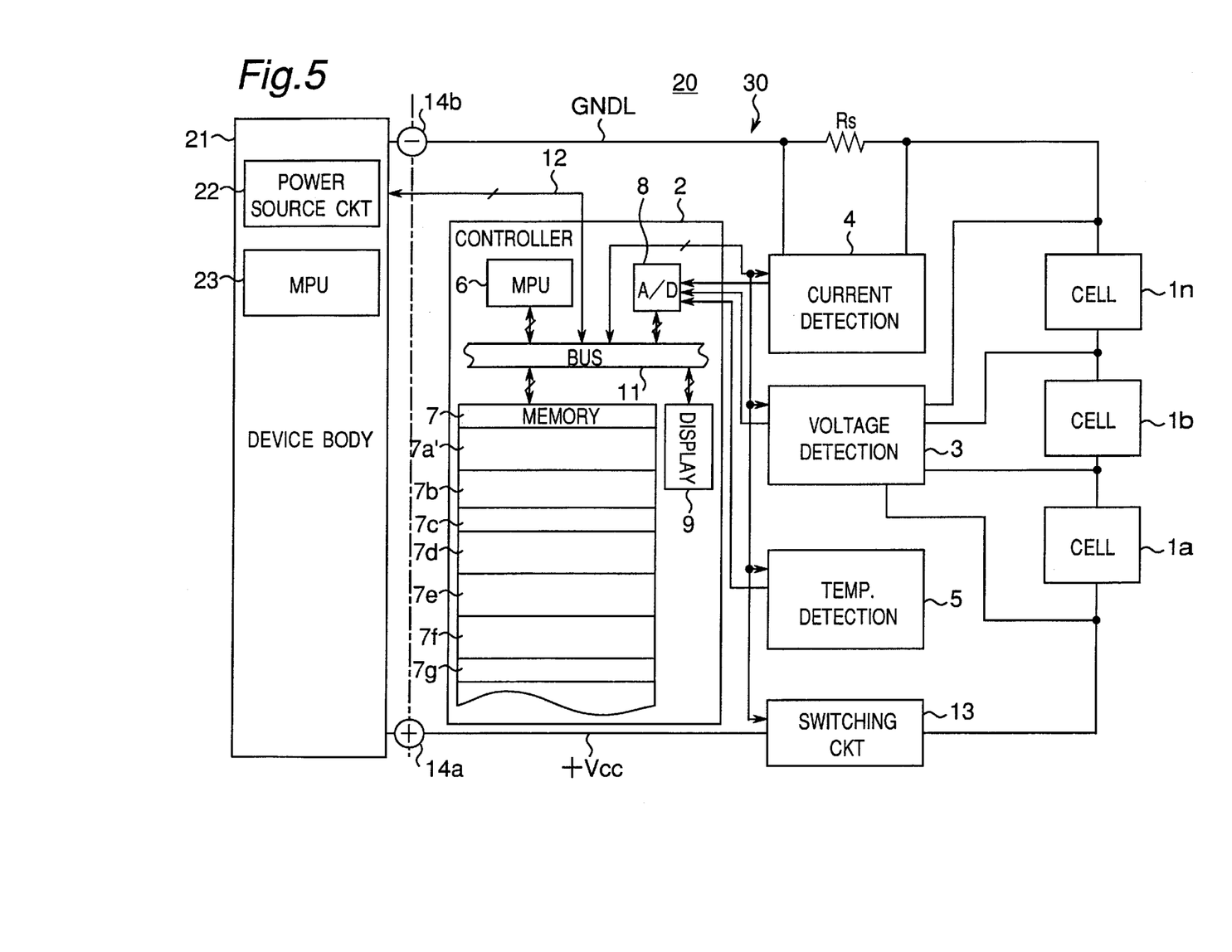
FIG. 5 is a circuit diagram showing a lithium rechargeable battery according to a second embodiment of the present invention incorporated into an electronic device.

In FIG. 5, a lithium rechargeable battery 30 according to a second embodiment of the present invention, which acts as the rechargeable battery arrangement, is detachably mounted in the electronic device 20. In the rechargeable battery 30, the program 7a for calculating the integrated quantity of discharged electricity in the rechargeable batter 10 of the first embodiment is replaced by a program 7a' for calculating the integrated quantity of discharged electricity at specific voltages. Furthermore, in the rechargeable battery 30, a table 7g indicative of the integrated quantity of discharged electricity at the specific voltages is additionally provided in the memory 7 in comparison with the memory 7 of the rechargeable battery 10 of the first embodiment. Since other constructions of the rechargeable battery 30 are similar to those of the rechargeable battery 10 of the first embodiment, the description is abbreviated for the sake of brevity.

In the same manner as the first embodiment, the voltage detection circuit 3 is connected to a positive electrode and a negative electrode of each of the battery cells 1a, 1b and 1n so as to detect terminal voltages of the respective battery cells 1a, 1b and 1n and outputs the present voltages of the respective battery cells 1a, 1b and 1n to the controller 2 in accordance with a control signal from the controller 2. The controller 2 causes the MPU 6 to execute the program 7a' and obtains the terminal voltages of the respective battery cells 1a, 1b and 1n by generating the above mentioned control signal so as to judge whether or not one of the terminal voltages of the respective battery cells 1a, 1b and 1n is either one of 3.4 V and 3.2 V.

The MPU 6 fetches the program 7a' from the memory 7 periodically at a period $\Delta t$ so as to execute the program 7a'. When the MPU 6 has executed the program 7a', the MPU 6 obtains present voltages V of the respective battery cells 1a, 1b and 1n from the voltage detection circuit 3 in accordance with the control signal and judges whether or not one of the present voltages V of the battery cells 1a, 1b and 1n is either one of predetermined monitoring voltages of 3.4 V and 3.2 V. In case one of the present voltages V of the battery cells 1a, 1b and 1n is either 3.4 V or 3.2 V, the MPU 6 obtains the present value i of discharge current of the rechargeable battery 30 and stores the present value i of discharge current of the rechargeable battery 30 in the memory 7. Furthermore, the MPU 6 obtains the present temperature T of the rechargeable battery 30 from the temperature detection circuit 5 and stores the present temperature T of the rechargeable battery 30 in a predetermined area of the memory 7. When one of the present voltages V of the battery cells 1a, 1b and 1n is 3.4 V in the table 7g, the MPU 6 obtains the integrated quantity $Q_n$ of discharged electricity corresponding to the present value i of discharge current of the rechargeable battery 30 and the present temperature T of the rechargeable battery 30 by referring to a table 75 in FIG. 8 and stores the integrated quantity $Q_n$ of discharged electricity in the memory 7. Meanwhile, when one of the present voltages V of the battery cells 1a, 1b and in is 3.2 V in the table 7g, the MPU 6 obtains the integrated quantity $Q_n$ of discharged electricity corresponding to the present value i of discharge current of the rechargeable battery 30 and the present temperature T of the rechargeable battery 30 by referring to a table 76 in FIG. 8 and stores the integrated quantity $Q_n$ of discharged electricity in the memory 7. Subsequently, the MPU 6 fetches the program 7b so as to calculate the residual capacity of the rechargeable battery 30. On the other hand, when none of the present voltages V of the battery cells 1a, 1b and 1n is 3.4 V or 3.2 V, processing of the program 7a' is terminated and waiting state for the next interruption processing is brought about.

In the same manner as the first embodiment, when the MPU 6 has executed the program 7d, the MPU 6 outputs the residual service life TL of the rechargeable battery 30 to the MPU 23 of the device body 21 but may output either the residual capacity $Q_r$ of the rechargeable battery 30 or both the residual service life TL and the residual capacity $Q_r$ of the rechargeable battery 30 to the MPU 23 of the device body 21 in place of the residual service life TL of the rechargeable battery 30. In this case, the residual service life TL or the residual capacity $Q_r$ of the rechargeable battery 30 may be stored in the memory 7 such that when a request for transmission of the residual service life TL or the residual capacity $Q_r$ of the rechargeable battery 30 is made by the MPU 23 of the device body 21 within a predetermined period from completion of the calculation, the MPU 6 outputs the residual service life TL or the residual capacity $Q_r$ of the rechargeable battery 30 to the device body 21 in response to the request from the MPU 23. The above mentioned predetermined period from completion of the calculation is set at an average period in which voltage of the rechargeable battery 30 drops from 3.4 V or 3.2 V at average discharge current in such a range that the calculation error does not become large. Meanwhile, in the case where when the request for transmission of the residual service life TL or the residual capacity $Q_r$ of the rechargeable battery 30 has been made by the MPU 23 of the device body 21, discharge voltage of the rechargeable battery 30 is not less than 3.4 V and the residual service life TL or the residual capacity $Q_r$ of the rechargeable battery 30 has not yet been calculated or in the case where the predetermined period has elapsed from completion of the calculation, the MPU 6 may respond to the MPU 23 to the effect that it is impossible to calculate the residual service life TL or the residual capacity $Q_r$ of the rechargeable battery 30 or by calculating the residual capacity of the rechargeable battery 30 by other methods, e.g., a conventional one referred to earlier.

Figure 7:
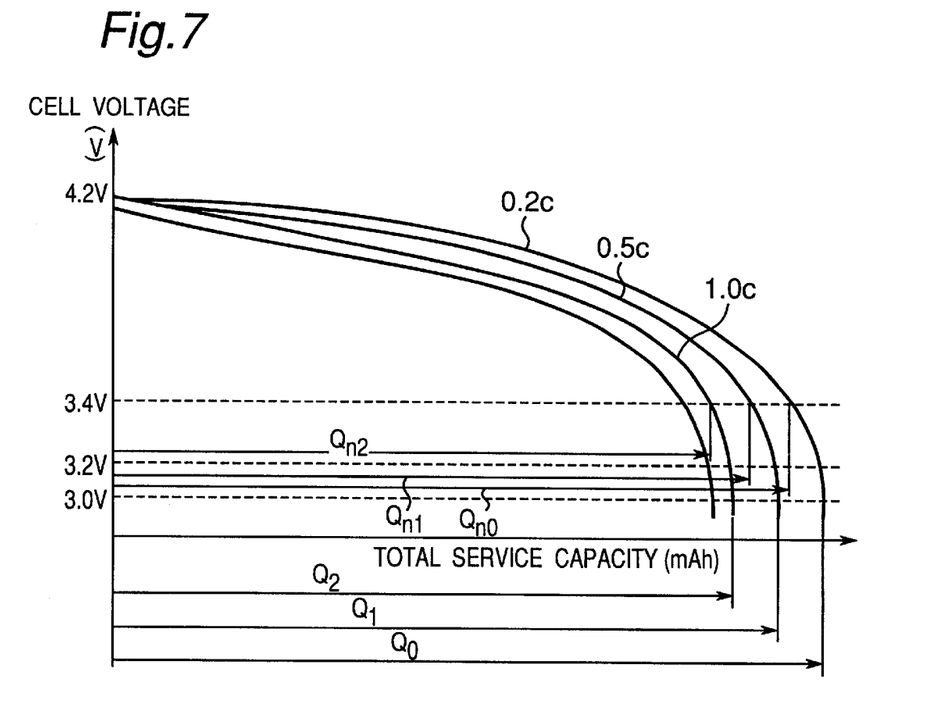
FIG. 7 is a graph showing characteristics of total service capacities of the battery of FIG. 5 at specific electric currents, respectively.
Figure 8:
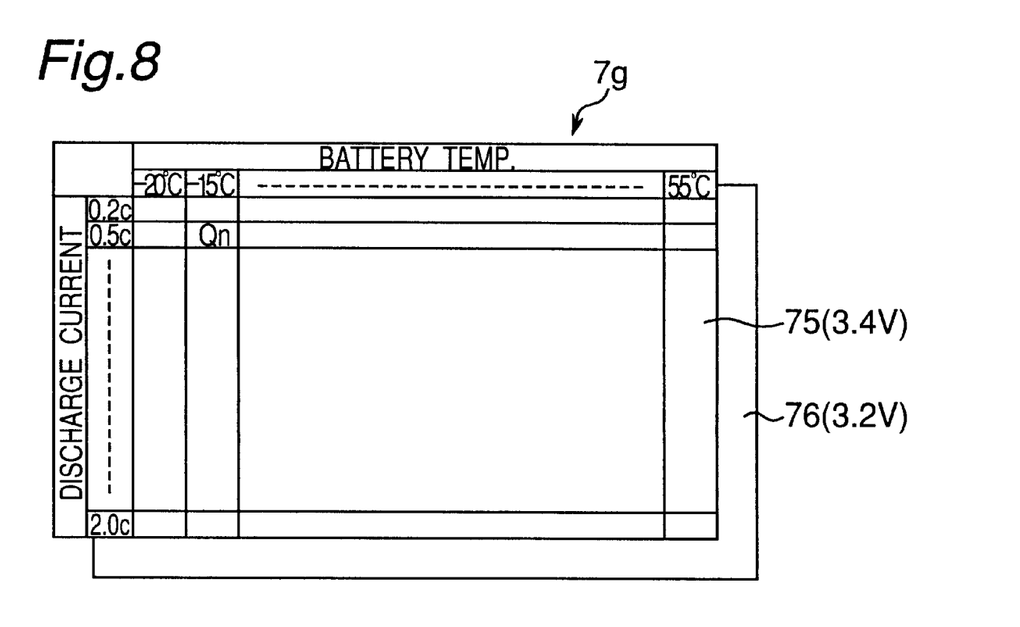
FIG. 8 is a view explanatory of a table on integrated quantities of discharged electricity of the battery of FIG. 5 versus values of electric currents at specific voltages.

The table 7g indicative of the integrated quantity of discharged electricity at the specific voltages is shown in FIG. 8. As shown in FIG. 8, the table 7g includes the table 75 for 3.4 V and the table 76 for 3.2 V. Meanwhile, FIG. 7 shows relation among total service capacities for discharge from full charging to the final discharge voltage of 3.0 V at the specific values of discharge current at a temperature of 25° C. In FIG. 7, "$Q_{n0}$", "$Q_{n1}$" and "$Q_{n2}$" denote integrated quantities of discharged electricity for discharge up to 3.4 V for the single battery cell 1 when the specific values of discharge current are 0.2 c, 0.5 c and 1.0 c, respectively. Although not specifically shown in FIG. 7, the integrated quantities $Q_{n0}$, $Q_{n1}$ and $Q_{n2}$ of discharged electricity are likewise obtained for 3.2 V. The thus obtained integrated quantities $Q_{n0}$, $Q_{n1}$, etc. of discharged electricity for the specific values of discharge current ranging from 0.2 c to 2.0 c at the temperature of 25° C. are stored as values $Q_n$ in the tables 75 and 76 of the table 7g. For other temperatures than 25° C., the values $Q_n$ are similarly stored in the tables 75 and 76 of the table 7g.

The table 7g is referred to by the MPU 6 when the MPU 6 executes the program 7a'. Namely, the MPU 6 judges whether the present voltage V of the selected battery cell 1 is 3.4 V or 3.2 V. If the MPU 6 has judged that the present voltage V of the battery cell 1 is 3.4 V, the MPU 6 refers to the table 75 and reads out of a row corresponding to or closest to the present value i of discharge current an integrated quantity $Q_n$ of discharged electricity corresponding to or closest to the present temperature T of the rechargeable battery 30 so as to store the integrated quantity $Q_n$ of discharged electricity in the parameter storage area 7f of the memory 7. Meanwhile, if the MPU 6 has judged that the present voltage V of the battery cell 1 is 3.2 V, the MPU 6 refers to the table 76 and likewise reads an integrated quantity $Q_n$ of discharged electricity out of the table 76 so as to store the integrated quantity $Q_n$ of discharged electricity in the parameter storage area 7f of the memory 7.

As will been seen from the graph of FIG. 7, the characteristic curves in the range of between 3.4 V and 3.0 V have large inclination and gaps among them are widened. On the other hand, the characteristic curves in the range of between 4.2 V and 3.6 V are comparatively linear so as to have small inclination and gaps among them are narrow. From such features of the curves, it is apparent that detection of the integrated quantity $Q_n$ of discharged electricity at a voltage of 3.0 V to about 3.4 V will give a more accurate value of the integrated quantity $Q_n$ of discharged electricity than that at a voltage of 3.4 V or more. Meanwhile, residual capacity of the rechargeable battery 30 offers a problem not when voltage of the battery cell 1 is high but when voltage of the battery cell 1 has reached about 3.4 V or less. Consequently, it is quite vital that a highly accurate integrated quantity of discharged electricity is obtained in the vicinity of 3.4 V or 3.2 V.

Figure 6A:
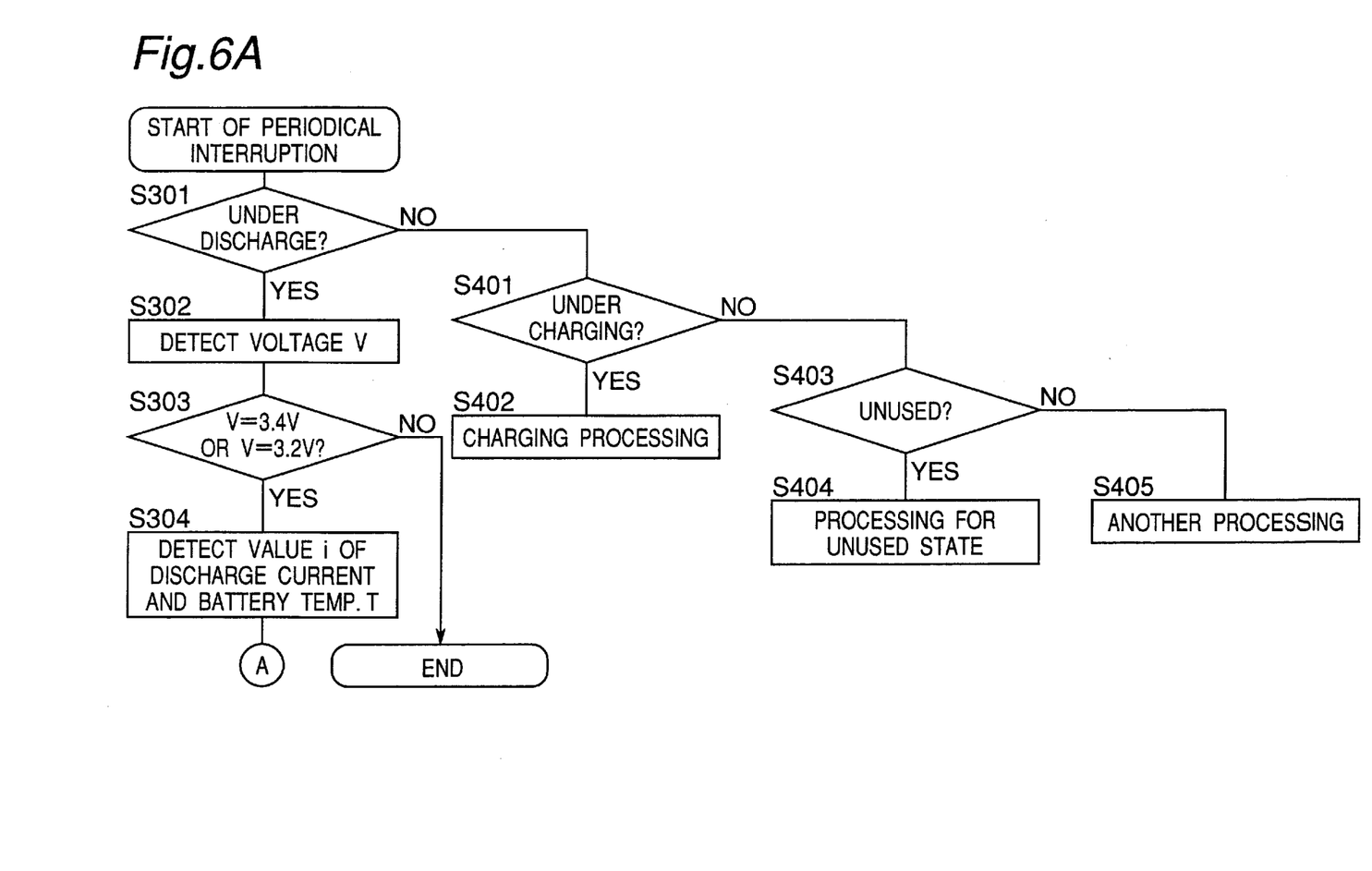
FIGS. 6A and 6B are flowcharts showing processings for calculating a residual capacity of the battery of FIG. 5.
Figure 6B:
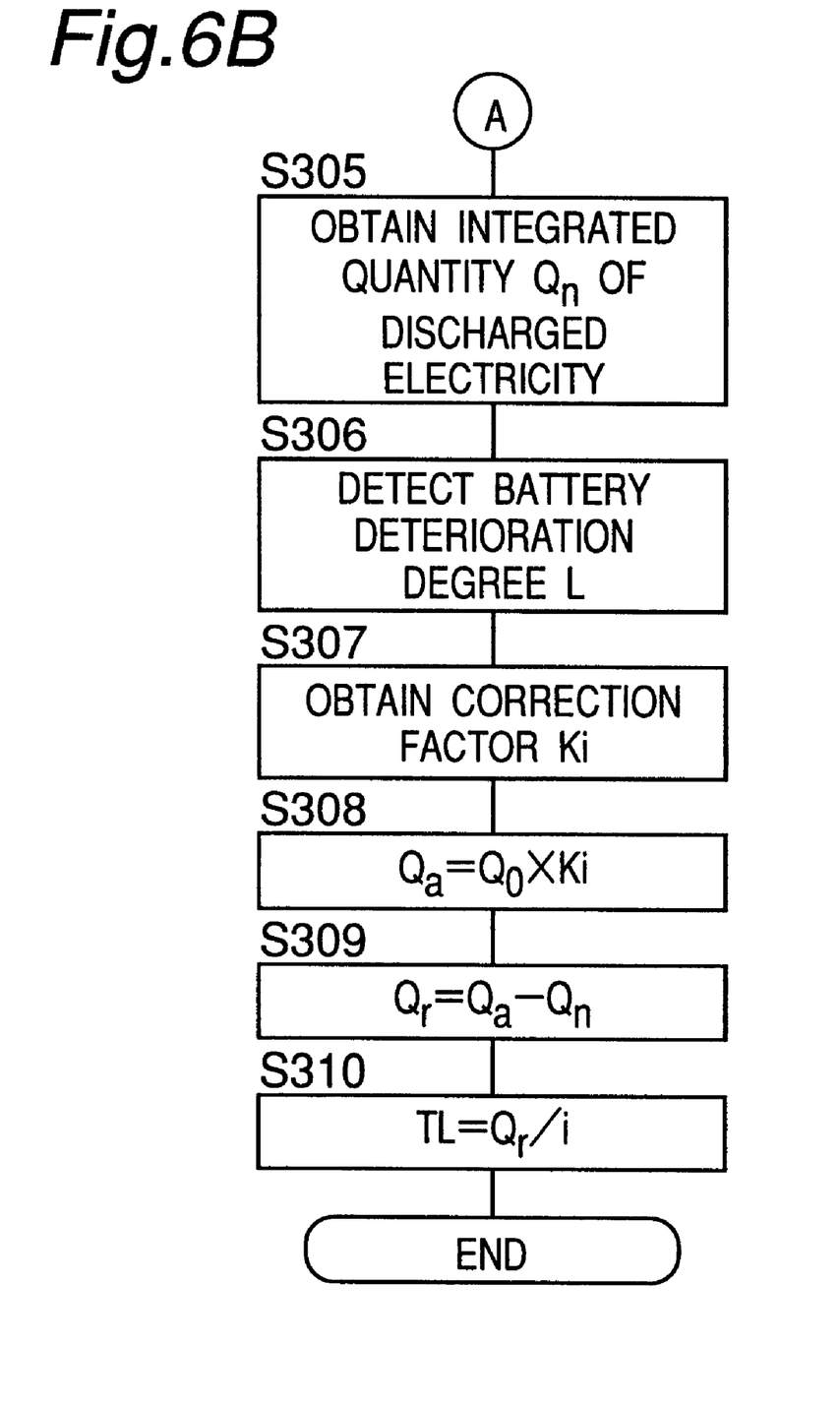

Hereinafter, processings for calculating a residual capacity of the rechargeable battery 30 are described with reference to flowcharts of FIGS. 6A and 6B. Since steps S301, S306 to S310 and S401 to S405 of FIGS. 6A and 6B are, respectively, identical with steps S101, S105 to S109 and S201 to S205 of FIGS. 2A and 2B, the description is abbreviated for the sake of brevity. In the case of "YES" at step S301, the program 7a' is executed by the MPU 6 and thus, the present voltages V of the respective battery cells 1a, 1b and 1n are detected and stored in the memory 7 at step S302. Then, at step S303, it is judged whether or not one of the present voltages V of the battery cells 1a, 1b and 1n is either one of 3.4 V and 3.2 V. In the case of "NO" at step S303, the processings are terminated. On the other hand, in the case of "YES" at step S303, the present value i of discharge current and the present temperature T of the rechargeable battery 30 are detected at step S304. Then, at step S305, the integrated quantity $Q_n$ of discharged electricity at 3.4 V or 3.2 V is obtained by referring to the table 7g and is stored in the parameter storage area 7f.

Meanwhile, at step S303, it is preferable that 3.4 V and 3.2 V have a tolerance of (±α). By giving the tolerance to 3.4 V and 3.2 V, the residual capacity of the rechargeable battery 30 can be calculated positively even if voltage of the battery cell 1 varies more or less. Furthermore, when a request for the residual capacity of the rechargeable battery 30 has been made by the device body 21, range capable of responding to the request is increased by the tolerance.

In the second embodiment, the table 7g has the two tables for the specific voltages of 3.4 V and 3.2 V, respectively. However, it is needless to say that if a number of tables corresponding to a number of voltages, respectively are provided in the table 7g, the integrated quantity of discharged electricity can be obtained more accurately.

Moreover, in the second embodiment, since the four deterioration degrees L of 1 to 4 of the rechargeable battery 30 are detected, the table 7g of FIG. 8 can be provided for each of the deterioration degrees L of the rechargeable battery 30. In this case, the number of each of the tables 75 and 76 of the table 7g is four corresponding to the deterioration degrees L of the rechargeable battery 30, respectively and step S306 for detecting the deterioration degree L of the rechargeable battery 30 precedes step S305 for obtaining the integrated quantity $Q_n$ of discharged electricity. Thus, after the deterioration degree L of the rechargeable battery 30 has been detected at step S306, the integrated quantity $Q_n$ of discharged electricity corresponding to the deterioration degree L of the rechargeable battery 30 is obtained at step S305 by referring to one of the tables 75 or 76, which corresponds to the deterioration degree L of the rechargeable battery 30.

As is clear from the foregoing description of the second embodiment of the present invention, since the total service capacity up to the final discharge voltage, which varies according to value of discharge current, is estimated from the present value of discharged electricity by referring to the first data storage means and the integrated quantity of discharged electricity at the specific voltages is obtained by reducing calculation error of the integrated quantity of discharged electricity by the second data storage means, the residual capacity of the rechargeable battery is calculated from the total service capacity and the integrated quantity of discharged electricity, so that the residual capacity of the rechargeable battery can be calculated more accurately and dynamically so as to correspond to value of discharge current at the time. As a result, since the residual capacity and the residual service life of the rechargeable battery can be detected more accurately, operating efficiency of the rechargeable battery can be improved.

What is claimed is:

1. A rechargeable battery arrangement in which total service capacity for discharge from full charging to a final discharge voltage varies according to discharge conditions for discharging charged electric charge, comprising:
   an integration means which integrates quantity of electric charge discharged between a point of start of discharge after charging and the present;
   a data storage means for storing a plurality of total service capacities for discharge at a plurality of values of discharge current, respectively in unique association with a specific one of the total service capacities for discharge at a specific one of the values of discharge current;
   a current detection means for detecting a present value of discharge current; and
   a calculation means which obtains, from data obtained by the data storage means on the basis of the present value of discharge current detected by the current detection means, a total service capacity corresponding to or closest to the present value of discharge current and calculates, from the total service capacity and an integrated value obtained by the integration means, a residual capacity of electric charge for discharge.

2. A rechargeable battery arrangement as claimed in claim 1, wherein the data storage means includes a table for associating the total service capacities with the values of discharge current and predetermined temperatures;
   wherein the table employs the specific one of the total service capacities at a specific one of the predetermined temperatures as a reference total service capacity and stores the total service capacities as ratios of the total service capacities to the reference total service capacity.

3. A rechargeable battery arrangement as claimed in claim 2, which includes a plurality of battery cells connected to each other in series;
   wherein the discharge current is electric current from the battery cells.

4. A rechargeable battery arrangement in which total service capacity for discharge from full charging to a final discharge voltage varies according to discharge conditions for discharging charged electric charge, comprising:

at least one battery cell;

a first data storage means for storing a plurality of total service capacities for discharge at a plurality of values of discharge current, respectively in unique association with a specific one of the total service capacities for discharge at a specific one of the values of discharge current;

a second data storage means for storing a plurality of integrated quantities of discharged electricity for discharge from full charging to a predetermined discharge voltage at the values of discharge current, respectively;

a voltage detection means for detecting a present voltage of the battery cell;

a current detection means for detecting a present value of discharge current;

a judgement means for judging whether or not the present voltage obtained by the voltage detection means is substantially coincident with the predetermined discharge voltage of the second data storage means; and a calculation means which obtains, from data obtained by the first data storage means on the basis of the present value of discharge current detected by the current detection means, a total service capacity corresponding to or closest to the present value of discharge current in case the judgement means judges that the present voltage is substantially coincident with the predetermined discharge voltage;

wherein the calculation means obtains from the second data storage means one of the integrated quantities of discharged electricity corresponding to the present value of discharge current so as to calculate, from the total service capacity and the one of the integrated quantities of discharged electricity, a residual capacity of electric charge for discharge.

5. A rechargeable battery arrangement as claimed in claim 4, wherein a plurality of the battery cells are connected to each other in series.

6. A rechargeable battery arrangement as claimed in claim 4, wherein the first data storage means includes a table for associating the total service capacities with the values of discharge current and predetermined temperatures;

wherein the table employs the specific one of the total service capacities at a specific one of the predetermined temperatures as a reference total service capacity and stores the total service capacities as ratios of the total service capacities to the reference total service capacity.

7. A rechargeable battery arrangement as claimed in claim 5, wherein the first data storage means includes a table for associating the total service capacities with the values of discharge current and predetermined temperatures;

wherein the table employs the specific one of the total service capacities at a specific one of the predetermined temperatures as a reference total service capacity and stores the total service capacities as ratios of the total service capacities to the reference total service capacity.

* * * * *